(12) United States Patent
Ishikawa et al.

(10) Patent No.: US 11,715,652 B2
(45) Date of Patent: Aug. 1, 2023

(54) MEMBER FOR SEMICONDUCTOR MANUFACTURING APPARATUS

(71) Applicant: NGK INSULATORS, LTD., Nagoya (JP)

(72) Inventors: Masaki Ishikawa, Handa (JP); Yuji Akatsuka, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 777 days.

(21) Appl. No.: 16/583,711

(22) Filed: Sep. 26, 2019

(65) Prior Publication Data

US 2020/0227291 A1  Jul. 16, 2020

Related U.S. Application Data

(60) Provisional application No. 62/738,205, filed on Sep. 28, 2018.

(51) Int. Cl.
*H01L 21/67* (2006.01)
*C04B 35/111* (2006.01)
(Continued)

(52) U.S. Cl.
CPC ...... *H01L 21/67098* (2013.01); *C04B 35/111* (2013.01); *C04B 35/64* (2013.01);
(Continued)

(58) Field of Classification Search
CPC .......... H01L 21/67098; H01L 21/6838; H01L 21/68785; H01L 21/67103; H01L 21/6831;
(Continued)

(56) References Cited

U.S. PATENT DOCUMENTS 6,490,145 B1   12/2002   Kholodenko et al.
9,650,302 B2   5/2017   Kimura et al.
(Continued)

FOREIGN PATENT DOCUMENTS

CN   1461288 A   12/2003
JP   2004128232 A   *   4/2004
(Continued)

OTHER PUBLICATIONS

Japanese Office Action (Application No. 2019-176643) dated Apr. 26, 2022 (with English translation).
(Continued)

*Primary Examiner* — Yuechuan Yu

(74) *Attorney, Agent, or Firm* — Burr Patent Law, PLLC

(57) ABSTRACT

A member for a semiconductor manufacturing apparatus includes a ceramic plate having an upper surface serving as a wafer mounting surface and incorporating an electrode, a ceramic dense plug disposed adjacent to a lower surface side of the ceramic plate and ceramic-bonded to the ceramic plate by a ring-shaped joint portion, a metal cooling plate joined to the lower surface of the ceramic plate in a portion other than the ring-shaped joint portion, and a gas flow channel. The gas flow channel includes a gas discharge hole that passes completely through the ceramic plate in the thickness direction of the ceramic plate and an internal gas flow channel that passes from the upper surface to the lower
(Continued)

surface of the dense plug while winding through the dense plug. The gas flow channel passes inside of an inner periphery of the joint portion.

7 Claims, 6 Drawing Sheets

(51) Int. Cl.
  *C04B 35/64* (2006.01)
  *H01J 37/32* (2006.01)
  *H01L 21/683* (2006.01)
  *H01L 21/687* (2006.01)
(52) U.S. Cl.
  CPC .. *H01J 37/32697* (2013.01); *H01J 37/32724* (2013.01); *H01L 21/6833* (2013.01); *H01L 21/6838* (2013.01); *H01L 21/68785* (2013.01)
(58) Field of Classification Search
  CPC .......... H01L 21/67109; H01L 21/6833; C04B 35/64; C04B 37/005; C04B 35/111; C04B 2237/365; C04B 2237/343; C04B 2235/3206; C04B 2235/445; C04B 2237/083; C04B 2237/86; C04B 2237/366; C04B 2237/064; C04B 2237/368; C04B 2237/08; H01J 37/32724; H01J 37/3244; H01J 37/32697; H01J 37/32715
  See application file for complete search history.

(56) References Cited

U.S. PATENT DOCUMENTS

| 2003/0150563 | A1 | 8/2003 | Kuibara et al. |
| 2009/0230636 | A1* | 9/2009 | Goto ................... H01L 21/6831 279/128 |
| 2009/0311869 | A1 | 12/2009 | Okesaku et al. |
| 2010/0304571 | A1* | 12/2010 | Larson ............. H01L 21/68757 156/60 |
| 2017/0243726 | A1 | 8/2017 | Kellogg |

FOREIGN PATENT DOCUMENTS

| JP | 2008-047883 A | 2/2008 |
| JP | 2009-218592 A | 9/2009 |
| JP | 2010-010154 A | 1/2010 |
| JP | 2010-123712 A | 6/2010 |
| JP | 2013-232641 A1 | 11/2013 |
| JP | 2013232641 A * | 11/2013 |
| JP | 5458050 B2 | 4/2014 |

OTHER PUBLICATIONS

Chinese Office Action, Chinese Application No. 201910926818.9, dated Jun. 1, 2023 (7 pages).

* cited by examiner

MEMBER FOR SEMICONDUCTOR MANUFACTURING APPARATUS

BACKGROUND OF THE INVENTION

1. Field of the Invention

The present invention relates to a member for a semiconductor manufacturing apparatus.

2. Description of the Related Art

Various members for semiconductor manufacturing apparatuses have been known. For example, a member for a semiconductor manufacturing apparatus described in PTL 1 is a member in which a metal cooling plate is joined to the lower surface of an electrostatic chuck having the upper surface serving as a wafer mounting surface. The cooling plate has a gas supply hole. The electrostatic chuck has a bottomed cylindrical hole that communicates with the gas supply hole and a gas discharge hole that passes through the electrostatic chuck from the bottom of the bottomed cylindrical hole to the wafer mounting surface. In the electrostatic chuck, a porous plug is put into the bottomed cylindrical hole and is bonded to the electrostatic chuck with a resin adhesive. In addition, for example, in the member for a semiconductor manufacturing apparatus described in PTL 2, a cooling plate is disposed on the lower surface of an electrostatic chuck having the upper surface serving as a wafer mounting surface via an intermediate plate. The cooling plate has a gas supply hole. The electrostatic chuck has a gas discharge hole that passes through the electrostatic chuck from the lower surface to the wafer mounting surface. The intermediate plate forms, together with the cooling plate, a cavity that communicates with the gas supply hole and the gas discharge hole. A dense plug is disposed in the cavity. The dense plug has an internal gas flow channel that passes through between the upper surface and the lower surface while winding through the dense plug. These members for a semiconductor manufacturing apparatus allow a wafer to be placed on the wafer mounting surface in a chamber and allows source gas to be introduced into the chamber. In addition, the members apply an RF voltage for generating a plasma to the cooling plate so as to generate a plasma and process the wafer. At this time, backside gas, such as helium, is introduced into the gas supply hole. The backside gas is supplied from the gas supply hole to the back surface of the wafer via one of the cavity of the porous plug and the internal gas flow channel of the dense plug and the gas discharge hole.

CITATION LIST

Patent Literature

PTL 1: JP 2013-232641 A
PTL 2: U.S. 2017/0243726 A1

SUMMARY OF THE INVENTION

In PTL 1, the porous plug is bonded to the bottomed cylindrical hole via a resin adhesive. In this case, the resin adhesive may deteriorate with long-term use. The deteriorated portion is undesirable because it may cause insulation breakdown. In addition, the porous plug has a problem in that the withstand voltage thereof is low. This is also undesirable because it may cause insulation breakdown. Furthermore, in PTL 2, since a dense plug is simply disposed in the cavity, a gap may be formed between the dense plug and the inner surface of the cavity. Such a gap is also undesirable because it may cause insulation breakdown. Even when, in the cavity, a dense plug is bonded via a resin adhesive so as to prevent formation of a gap, the resin adhesive may deteriorate with long-term use, as described above. Thus, insulation breakdown may occur.

The present invention has been made to solve the above issue, and it is a main object of the present invention to reduce the occurrence of insulation breakdown than in the related art.

According to the present invention, a member for a semiconductor manufacturing apparatus includes a ceramic plate having an upper surface serving as a wafer mounting surface and incorporating an electrode, a ceramic dense plug disposed adjacent to a lower surface side of the ceramic plate and ceramic-bonded to the ceramic plate by a ring-shaped joint portion, a metal cooling plate joined to the lower surface of the ceramic plate in a portion other than the joint portion, and a gas flow channel.

The gas flow channel includes a gas discharge hole that passes completely through the ceramic plate in the thickness direction of the ceramic plate and an internal gas flow channel that passes from the upper surface to the lower surface of the dense plug while winding through the dense plug. The gas flow channel passes inside of an inner periphery of the joint portion.

According to the member for a semiconductor manufacturing apparatus, the ceramic plate and the ceramic dense plug are ceramic-bonded by the ring-shaped joint portion. That is, the joint portion between the ceramic plate and the dense plug is ceramic. For this reason, deterioration of the joint portion is less likely to occur than in the case where the two are bonded using a resin adhesive. In addition, the dense plug has a higher withstand voltage than the porous plug. Furthermore, since the internal gas flow channel of the dense plug passes from the upper surface to the lower surface of the dense plug while winding through the dense plug, the length of the internal gas flow channel is greater than in the case where the internal gas flow channel passes from the upper surface to the lower surface of the dense plug straight. Thus, the occurrence of electrical discharge via the internal gas flow channel can be prevented. As a result, an effect that insulation breakdown is less likely to occur can be obtained, as compared with existing members for a semiconductor manufacturing apparatus.

As used in the specification, the terms "up" and "down" are used to indicate a relative positional relationship, not an absolute positional relationship. Accordingly, the terms "up" and "down" change to "down" and "up", "left" and "right", or "front" and "rear", respectively, depending on the orientation of a ceramic heater.

In addition, as used in the specification, the term "ceramic bonding" refers to a condition in which ceramics are joined to each other by ceramic. A ceramic plate and a dense plug may be joined to each other by, for example, solid phase bonding, such as sinter bonding or diffusion bonding. Sinter bonding is a bonding method in which ceramic powders are inserted into a bonding interface, are heated under an applied pressure, and are sintered. Diffusion bonding is a bonding method in which ceramics are in direct contact with each other and are heated under pressure to diffuse constituent elements. Alternatively, the ceramic plate and the dense plug may be bonded with, for example, a ceramic adhesive.

The porosity of the dense plug is preferably less than 0.1%. In addition, it is desirable that the lower opening of the internal gas flow channel be invisible through the upper opening, as viewed from above. It is desirable that the ceramic of the dense plug be of high purity (e.g., the degree of purity be greater than or equal to 99%).

According to the member for a semiconductor manufacturing apparatus of the present invention, it is desirable that the joint portion be a ceramic sintered body. This is because the withstand voltage is higher than that of a joint portion which is not a sintered body, for example, the one made by simply curing a ceramic adhesive.

According to the member for a semiconductor manufacturing apparatus of the present invention, the upper surface of the dense plug may be provided with a concave portion that communicates with the gas discharge hole and the internal gas flow channel and that has an opening larger than the internal gas flow channel. In this way, since the internal gas flow channel communicates with the gas discharge hole via the concave portion having a larger opening than the internal gas flow channel, the position adjustment between the gas discharge hole and the internal gas flow channel is facilitated. In the member for a semiconductor manufacturing apparatus having such a structure, the gas discharge hole may be formed from a plurality of small gas holes, and the concave portion may communicate with the plurality of small gas holes. In this manner, the gas can be supplied to the plurality of small gas holes through the concave portion.

According to the member for a semiconductor manufacturing apparatus of the present invention, the internal gas flow channel may be a passage that is spiral or zigzag in shape. In this manner, the occurrence of electrical discharge via the internal gas flow channel can be more reliably prevented.

According to the member for a semiconductor manufacturing apparatus of the present invention, the cooling plate may include a cylindrical hole having an opening on the upper surface thereof, and at least part of the dense plug may be disposed inside the cylindrical hole. Note that the cylindrical hole may be a bottomed hole or a through-hole. In the member for a semiconductor manufacturing apparatus having such a structure, the dense plug may include a columnar plug body including the internal gas flow channel and a cylindrical skirt portion protruding from the plug body downward. In this case, since the skirt portion covers a metal exposed to the cylindrical hole, the insulation distance can be increased.

DETAILED DESCRIPTION OF THE INVENTION

Figure 1:
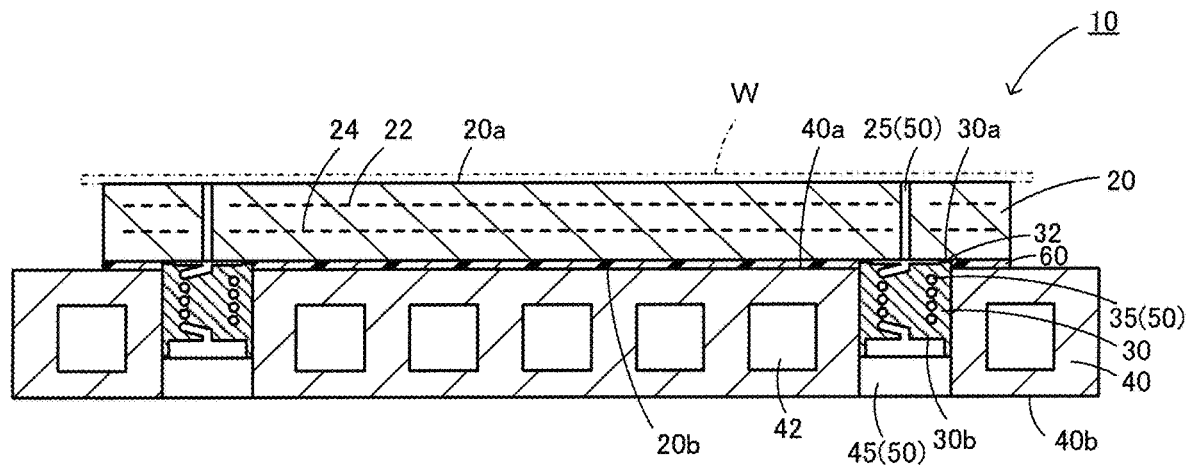
FIG. 1 is a longitudinal sectional view of a member 10 for a semiconductor manufacturing apparatus.
Figure 2:
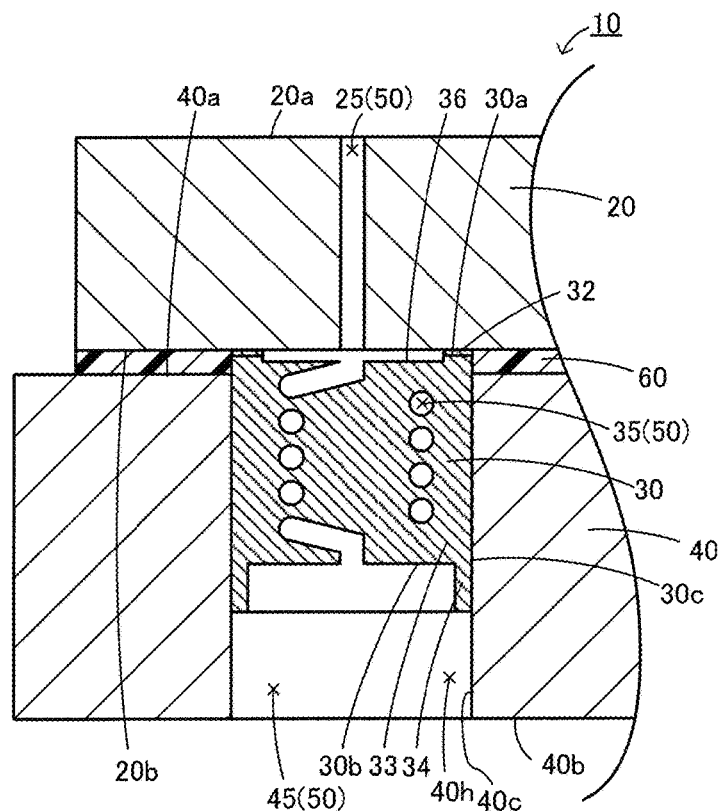
FIG. 2 is a partial enlarged view of FIG. 1.
Figure 3:
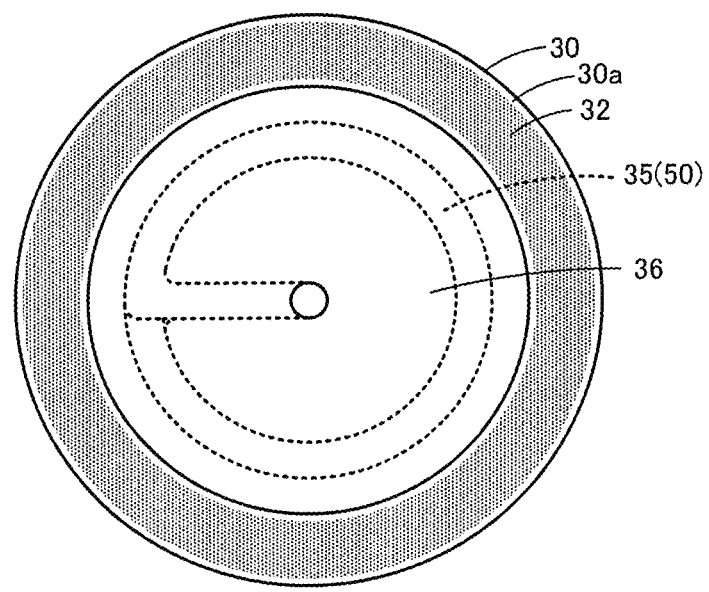
FIG. 3 is a top view of a dense plug 30 and a joint portion 32.

An exemplary embodiment of the present invention is described below with reference to the accompanying drawings. FIG. 1 is a longitudinal sectional view of a member 10 for a semiconductor manufacturing apparatus. FIG. 2 is a partial enlarged view of FIG. 1, and FIG. 3 is a top view of a dense plug 30 and a joint portion 32.

The member 10 for a semiconductor manufacturing apparatus includes a ceramic plate 20, a dense plug 30, a cooling plate 40, and a gas flow channel 50.

The ceramic plate 20 is a disc made of a ceramic, such as an alumina sintered body (for example, a disc with a diameter of 300 mm and a thickness of 5 mm). The upper surface 20a of the ceramic plate 20 serves as a wafer mounting surface. The ceramic plate 20 has an electrostatic electrode 22 and a heater electrode 24 incorporated therein and includes a plurality of gas discharge holes 25 (for example, 0.5 mm in diameter) that pass therethrough in the thickness direction. Concave and convex portions (not illustrated) are provided on the upper surface 20a of the ceramic plate 20 by embossing, and the gas discharge holes 25 have openings at the bottoms of the concave portions. The electrostatic electrode 22 is a flat electrode, and a DC voltage is applied via a power feeding rod (not illustrated). When a DC voltage is applied to the electrostatic electrode 22, a wafer W is attracted and fixed to the wafer mounting surface by the electrostatic attraction force. When application of the DC voltage is stopped, the attracted and fixed wafer W is released from the wafer mounting surface. The heater electrode 24 is formed by extending a heater wire from one terminal to the other terminal of the heater wire over the entire wafer mounting surface in the form of a picture drawn with a single stroke. Electric power is supplied to the heater electrode 24 through a power feeding rod (not illustrated). Both the electrostatic electrode 22 and the heater electrode 24 are formed so as not to be exposed to the gas discharge holes 25. The ceramic plate 20 having such a structure is referred to as an "electrostatic chuck heater". In the figures other than FIG. 1, the electrostatic electrode 22 and the heater electrode 24 are not illustrated.

The dense plug 30 is a ceramic plug of the same type as the ceramic plate 20 (for example, with an outer diameter of 4 mm and a total length of 4 mm) and is provided corresponding to each of the gas discharge holes 25. The dense plug 30 has an internal gas flow channel 35 that passes through from an upper surface 30a to a lower surface 30b of the dense plug 30 while bending spirally. The internal gas flow channel 35 has a smooth spiral shape that has a circular outer periphery as viewed from above (for example, the spiral has a coil diameter of 20 mm, a pitch of 0.7 mm, and a flow channel cross-sectional diameter of 0.1 mm) (refer to FIG. 3). The internal gas flow channel 35 communicates with the gas discharge hole 25 of the ceramic plate 20. The dense plug 30 includes a columnar plug body 33 having the internal gas flow channel 35 and a cylindrical skirt portion 34 (having, for example, an inner diameter of 3 mm and a length of 3 mm) that protrudes from the plug body 33 downward. The upper surface 30a of the dense plug 30 is provided with a concave portion 36 (having, for example, an inner diameter of 3 mm and a depth of 0.1 mm). The concave portion 36 communicates with the gas discharge hole 25 and the internal gas flow channel 35 and has an opening larger than that of the internal gas flow channel 35. The dense plug 30 is ceramic-bonded to a lower surface 20b of the ceramic plate 20 by a ceramic joint portion 32 of a type similar to the ceramic plate 20. The joint portion 32 is ring-shaped and is formed on a ring-shaped portion of the upper surface 30a of the dense plug 30 around the concave portion 36 (refer to FIG. 3). The dense plug 30 may be manufactured by, for example, firing a compact formed using a 3D printer. Alternatively, the dense plug 30 may be manufactured by firing a compact formed by a mold casting technique. Details of the mold casting technique are described in, for example, Japanese Patent No. 5458050. In mold casting, a ceramic slurry containing a ceramic powder, a solvent, a dispersant, and a gelling agent is introduced into a molding space of a forming mold. The gelling agent reacts chemically to cause the ceramic slurry to gelate. Thus, a compact is formed in the forming mold. In mold casting, the compact may be formed in a forming mold by using, as the forming mold, an outer mold and a core mold made of a material having a low melting point, such as wax. Subsequently, the forming mold may be heated to a temperature above the melting point of the forming mold. Thus, the forming mold can be melted away or eliminated to produce a compact.

The cooling plate 40 is a metal disc (a disc having the same diameter as the ceramic plate 20 or a diameter larger than the plate) made of, for example, aluminum or an aluminum alloy. The cooling plate 40 has a refrigerant flow channel 42 formed therein. The refrigerant flow channel 42 allows a refrigerant to circulate therethrough. The cooling plate 40 has a plurality of cylindrical holes 40h that pass completely therethrough in the thickness direction, that is, that have openings in an upper surface 40a and the lower surface 40b. The dense plug 30 is disposed inside the cylindrical hole 40h, and a portion of the cylindrical hole 40h in which the dense plug 30 is not disposed serves as a gas supply hole 45. The diameter of the cylindrical hole 40h is slightly larger than the diameter of the dense plug 30 (for example, by 0.5 mm or 1 mm). Consequently, a gap (not illustrated) is present between a wall surface 40c surrounding the cylindrical hole 40h and an outer peripheral surface 30c of the dense plug 30. The upper surface 40a of the cooling plate 40 is bonded to the lower surface 20b of the ceramic plate 20 via a resin bonding sheet 60. The bonding sheet 60 is provided with a hole that allows the dense plug 30 inserted therethrough (the diameter of the hole is slightly larger than the diameter of the dense plug 30). Note that the upper surface 40a of the cooling plate 40 may be joined to the lower surface 20b of the ceramic plate 20 via a brazing material layer.

The gas flow channel 50 is formed to pass inside of the inner periphery of the joint portion 32. The gas flow channel 50 includes the gas discharge hole 25 provided in the ceramic plate 20 and the internal gas flow channel 35 provided in the dense plug 30. In addition, the gas flow channel 50 includes the gas supply hole 45 provided in the cooling plate 40. Thus, the gas supplied from the gas supply hole 45 passes through the internal gas flow channel 35 and is discharged from the gas discharge hole 25 onto the mounting surface.

A usage example of the member 10 for a semiconductor manufacturing apparatus configured as described above is described below. The wafer W is mounted on the wafer mounting surface first, with the member 10 for a semiconductor manufacturing apparatus placed in a chamber (not illustrated). Thereafter, the chamber is depressurized by a vacuum pump until the degree of vacuum reaches a predetermined value. A DC voltage is applied to the electrostatic electrode 22 of the ceramic plate 20 to generate an electrostatic attraction force and, thus, the wafer W is attracted and fixed to the wafer mounting surface. Subsequently, a reaction gas atmosphere with a predetermined pressure (for example, several tens to several hundreds Pa) is generated inside the chamber. In the reaction gas atmosphere, a high frequency voltage is applied between the upper electrode (not illustrated) provided in a ceiling portion of the chamber and the electrostatic electrode 22 of the member 10 for semiconductor manufacturing apparatus. In this manner, plasma is generated. Note that instead of applying a high frequency voltage between the upper electrode and the electrostatic electrode 22, a high frequency voltage may be applied between the upper electrode and the cooling plate 40. The surface of the wafer W is etched by the generated plasma. A refrigerant is circulated in the refrigerant flow channel 42 of the cooling plate 40. Electric power is supplied to the heater electrode 24 so that the temperature of the wafer W reaches a preset target temperature. Backside gas, such as helium, is introduced from a gas cylinder (not illustrated) into the gas flow channel 50. The backside gas is supplied to the wafer mounting surface through the gas supply hole 45, the internal gas flow channel 35, and the gas discharge hole 25. If the gas flow channel is straight, electrical discharge may occur through the gas flow channel between the wafer W and the cooling plate 40 during generation of the plasma. In addition, during generating of the plasma, if the joint portion is an adhesive made of resin, the resin may deteriorate with long-term use, and electrical discharge may occur along the creepage surface of the dense plug 30 between the wafer W and the cooling plate 40.

Figure 4A:
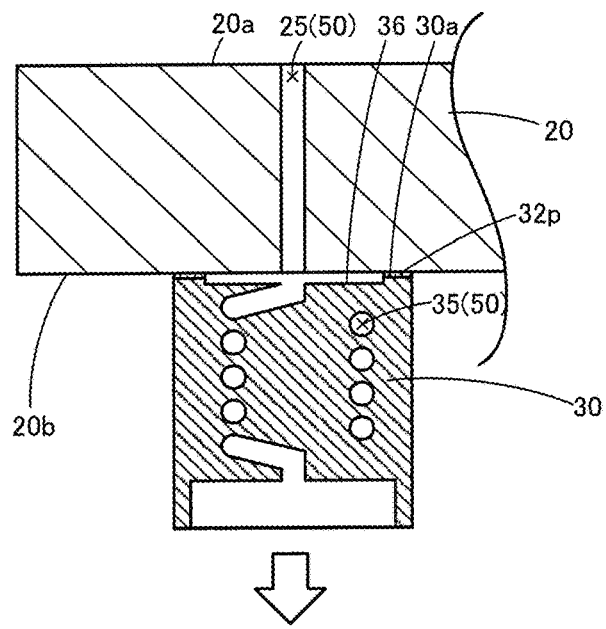
FIGS. 4A and 4B are manufacturing process diagrams of the member 10 for a semiconductor manufacturing apparatus.
Figure 4B:
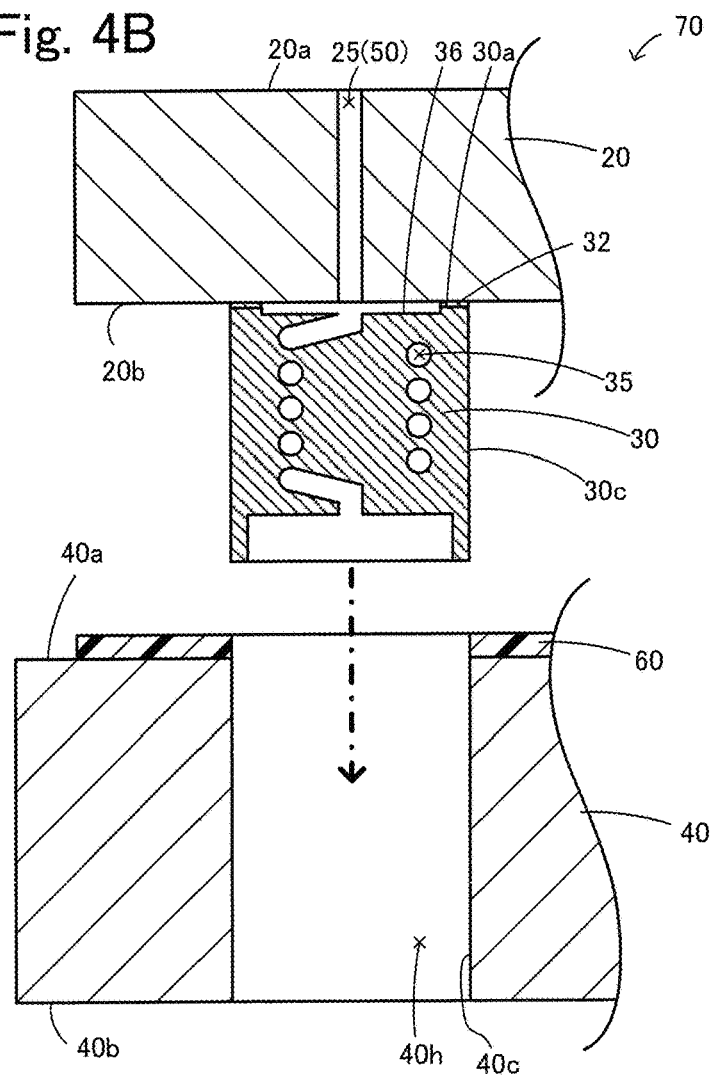

A manufacturing example of the member 10 for a semiconductor manufacturing apparatus is described below. FIGS. 4A and 4B are manufacturing process diagrams of the member 10 for a semiconductor manufacturing apparatus. The ceramic plate 20 and the dense plug 30 are prepared first. A bonding material paste 32p containing a ceramic powder of the same type as the ceramic plate 20, a sintering aid, and a solvent is applied in a ring shape onto the upper surface 30a of the dense plug 30. Examples of the sintering aid include magnesium fluoride, calcium oxide, silicon oxide, magnesium nitrate, and titanium oxide. Examples of the solvent include methanol and ethanol. The upper surface 30a having the bonding material paste 32p applied thereto is placed on top of the lower surface 20b of the ceramic plate 20 (refer to FIG. 4A). At this time, the upper surface 30a is placed such that each of the gas discharge holes 25 of the ceramic plate 20 faces one of the concave portions 36 of the dense plug 30. Thereafter, the ceramic plate 20 and the dense plug 30 are heated under pressure to fire the bonding material paste 32p. In this manner, the two are bonded (sinter-bonded). The bonding material paste 32p is fired to make the joint portion 32. At this time, since the bonding material paste 32p contains a sintering aid, bonding can be achieved without much increase in pressure and in temperature. As a result, a bonded body 70 is obtained in which a plurality of dense plugs 30 are bonded to the lower surface 20b of the ceramic plate 20 via the ring-shaped joint portion 32 made of a ceramic sintered body (refer to FIG. 4B). The interface between the ceramic plate 20 and the joint portion 32 and the interface between the dense plug 30 and the joint portion 32 contain a sintering aid component. Note that if the joint portion 32 is made of an alumina sintered body, magnesium fluoride ($MgF_2$) is preferable as a sintering aid, in consideration of maintaining a high volume resistivity and withstand voltage of the alumina sintered body. This is because $MgF_2$ is less likely to reduce the volume resistivity and the withstand voltage as compared with other sintering aids (for example, CaO and the like).

Subsequently, the cooling plate 40 having the cylindrical hole 40h formed therein to pass therethrough in the thickness direction is prepared (refer to FIG. 4B). A resin bonding sheet 60 is disposed on at least one of the upper surface 40a of the cooling plate 40 and the lower surface 20b of the ceramic plate 20 of the bonded body 70 (in this example, the upper surface 40a). Thereafter, the two are bonded together. At this time, a gap is formed between the wall surface 40c surrounding the cylindrical hole 40h and the outer peripheral surface 30c of the dense plug 30. In this manner, the member 10 for a semiconductor manufacturing apparatus is achieved. Instead of bonding the upper surface 40a of the cooling plate 40 and the lower surface 20b of the ceramic plate 20 by the bonding sheet 60, the two may be bonded by a brazing material.

In the member 10 for a semiconductor manufacturing apparatus described in detail above, the ceramic plate 20 and the ceramic dense plug 30 are ceramic-bonded by the ring-shaped joint portion 32. That is, the joint portion between the ceramic plate 20 and the dense plug 30 is ceramic. A ceramic, such as an alumina sintered body, has not only a higher withstand voltage than a resin, but also has a high degree of corrosion resistance to an atmosphere (for example, plasma) during a semiconductor manufacturing process. Accordingly, a ceramic is less likely to deteriorate due to long-term use. For this reason, deterioration of the joint portion 32 is less likely to occur than in the case where the two are bonded using a resin adhesive. In this manner, the insulation breakdown passing through the creepage surface of the plug can be prevented. In addition, the dense plug 30 has a higher withstand voltage than a porous plug. For this reason, insulation breakdown is less likely to occur than in the case where, for example, a porous plug or a porous plug having a dense outer peripheral portion (for example, one obtained by fitting the porous plug into a dense cylindrical member to integrate the two) is used instead of using the dense plug 30. Furthermore, since the internal gas flow channel 35 of the dense plug 30 passes from the upper surface 30a to the lower surface 30b of the dense plug 30 while winding through the dense plug 30, the occurrence of electrical discharge via the internal gas flow channel 35 can be prevented. For these reasons, insulation breakdown which passes through the internal space of the plug can be prevented. As a result, an effect that insulation breakdown is less likely to occur can be obtained, as compared with existing plugs.

In addition, the cooling plate 40 has a cylindrical hole 40h with an opening formed in the upper surface 40a, and at least part of the dense plug 30 is disposed in the cylindrical hole 40h. The dense plug 30 has the columnar plug body 33 including an internal gas flow channel 35 and the cylindrical skirt portion 34 that protrudes from the plug body 33 downward. Since the skirt portion 34 covers a metal exposed to the cylindrical hole 40h, the insulation distance can be increased. At this time, if the lower end of the skirt portion 34 reaches the lower end of the cylindrical hole 40h, the metal exposed to the cylindrical hole 40h is completely covered by the skirt portion 34. Thus, electrical discharge that occurs through the gas flow channel 50 is reliably prevented.

Furthermore, since the upper surface 30a of the dense plug 30 is provided with the concave portion 36 that communicates with the gas discharge hole 25 and the internal gas flow channel 35 and that has an opening larger than the top end of the internal gas flow channel 35, the position adjustment between the gas discharge hole 25 and the internal gas flow channel 35 is facilitated.

Still furthermore, since the internal gas flow channel 35 is a spiral passage, the occurrence of electrical discharge through the internal gas flow channel 35 can be more reliably prevented.

Yet still furthermore, a gap is present between the wall surface 40c surrounding the cylindrical hole 40h and the outer peripheral surface 30c of the dense plug 30. Consequently, unlike the case where the wall surface 40c and the outer peripheral surface 30c of the dense plug 30 are bonded, it is not necessary to consider heat transfer between the dense plug 30 and the cooling plate 40. As a result, the design of temperature control of the wafer W is facilitated.

Yet still furthermore, since the ceramic plate 20 and the dense plug 30 are bonded using the bonding material paste 32p containing the ceramic powder and the sintering aid, the two can be bonded without much increase in pressure and in temperature.

It should be understood that the present invention is not intended to be limited by the embodiment described above, and various aspects of the invention may be practiced without departing from the technical scope of the invention. For example, any appropriate combination of other examples described below may be applied to the invention.

Figure 5:
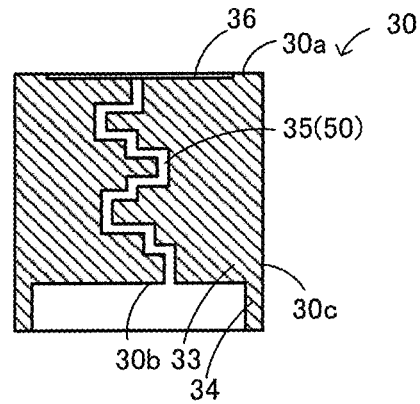
FIG. 5 is a longitudinal sectional view of another example of the dense plug 30.
Figure 6:
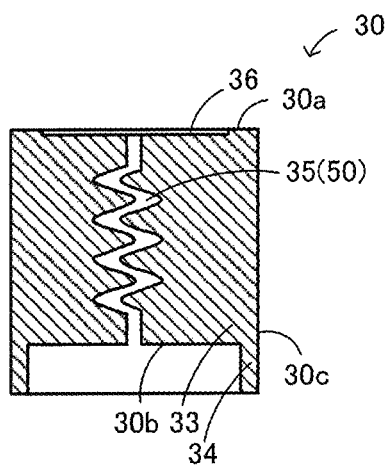
FIG. 6 is a longitudinal sectional view of another example of the dense plug 30.

For example, in the embodiment described above, the internal gas flow channel 35 may be zigzag in shape as illustrated in FIGS. 5 and 6. FIGS. 5 and 6 are longitudinal sectional views of other examples of the dense plug 30. In FIG. 5, the internal gas flow channel 35 has a right-angled zigzag shape. Note that the angle of the crests may be acute or obtuse. In FIG. 6, the internal gas flow channel 35 has rounded crests, that is, no corners. The zigzag may be planar or three-dimensional. Alternatively, the internal gas flow channel 35 may have a spiral shape with crests so that the outer periphery thereof is polygonal as viewed from above. The number of turns of the spiral and the number of crests of the zigzag are not particularly limited.

Figure 7:
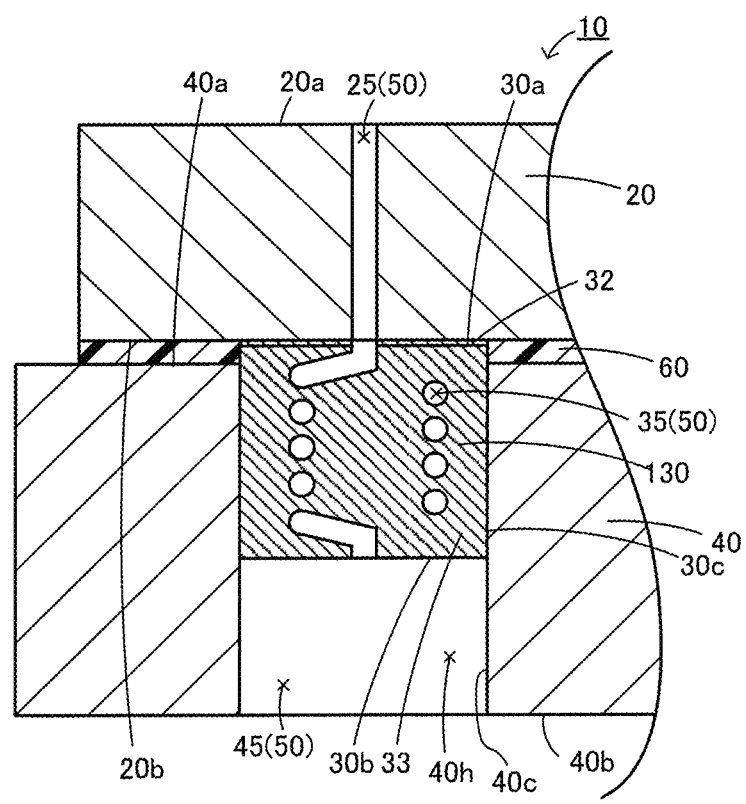
FIG. 7 is a partial enlarged view of another example of the member 10 for a semiconductor manufacturing apparatus.

While the above embodiment has been described with reference to the dense plug 30 having the skirt portion 34 and the concave portion 36, at least one of the skirt portion 34 and the concave portion 36 may be removed, as illustrated in FIG. 7. FIG. 7 is a partial enlarged view of another example of the member 10 for a semiconductor manufacturing apparatus. The member 10 for a semiconductor manufacturing apparatus includes a dense plug 130 in which both the skirt portion 34 and the concave portion 36 are removed. The same reference numbers are used in FIG. 7 for constituent elements that are the same as those illustrated in the above-described embodiment, and description of the constituent elements are not repeated. Even in such a dense plug 130, the internal gas flow channel 35 passes through the dense plug 130 from the upper surface 30a to the lower surface 30b while winding through the dense plug 130. Consequently, the length of the internal gas flow channel 35 is greater than the length of the dense plug 130 (the plug body 33) and, thus, insulation breakdown is less likely to occur. In the dense plug 130, the lower end of the plug body 33 may reach the lower end of the cylindrical hole 40h of the cooling plate 40. In this case, since the internal gas flow channel 35 of the dense plug 130 passes completely through the cooling plate 40, the internal gas flow channel 35 further functions as the gas supply hole 45. Even in the dense plug 130, the internal gas flow channel 35 may be zigzag in shape, as illustrated in FIGS. 5 and 6.

Figure 8:
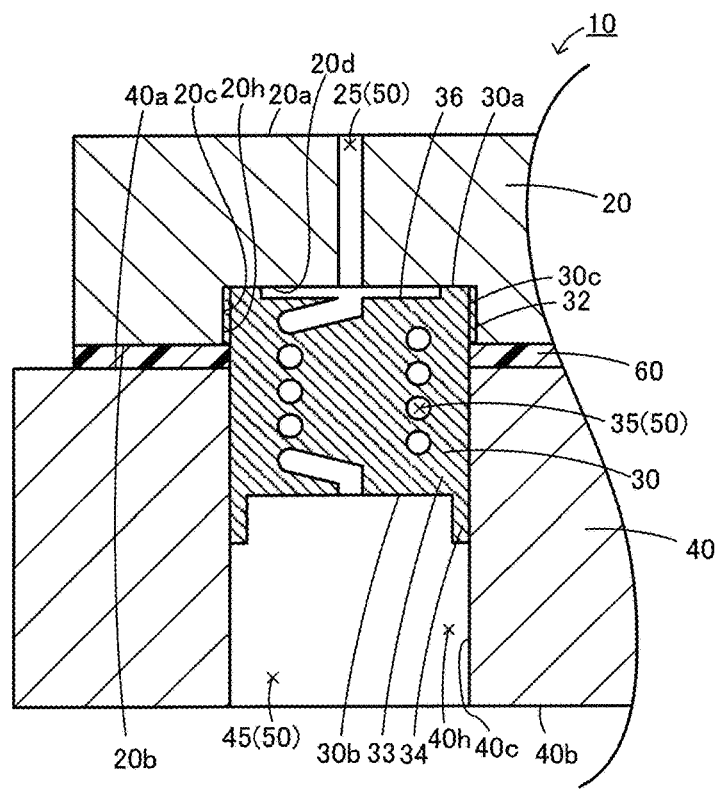
FIG. 8 is a partial enlarged view of another example of the member 10 for a semiconductor manufacturing apparatus.
Figure 9:
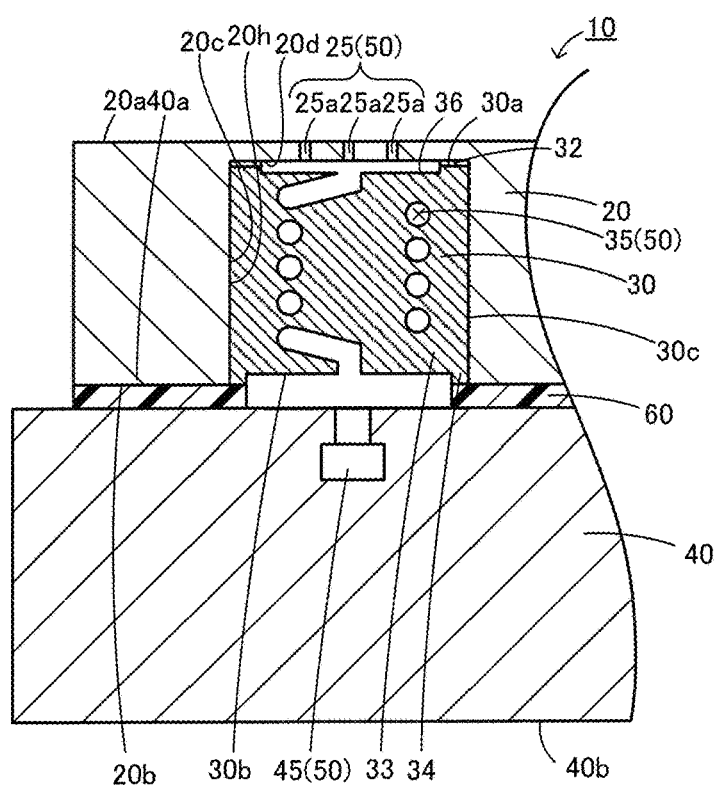
FIG. 9 is a partial enlarged view of another example of the member 10 for a semiconductor manufacturing apparatus.

In the embodiment described above, as illustrated in FIGS. 8 and 9, the ceramic plate 20 has a bottomed cylindrical hole 20h with an opening in the lower surface 20b, and at least part of the dense plug 30 is disposed inside the bottomed cylindrical hole 20h. FIGS. 8 and 9 are partial enlarged views of other examples of the member 10 for a semiconductor manufacturing apparatus. The same reference numbers are used in FIGS. 8 and 9 for constituent elements that are the same as those illustrated in the above-described embodiment, and description of the constituent elements are not repeated. In this case, part of the dense plug 30 may be disposed inside the bottomed cylindrical hole 20h, as illustrated in FIG. 8. Alternatively, the entirety of the dense plug 30 may be disposed inside the bottomed cylindrical hole 20h, as illustrated in FIG. 9. Furthermore, the dense plug 30 may be ceramic-bonded to a wall surface 20c of the bottomed cylindrical hole 20h by the ring-shaped joint portion 32, as illustrated in FIG. 8. Alternatively, the dense plug 30 may be ceramic-bonded to a bottom surface 20d of the bottomed cylindrical hole 20h by the ring-shaped joint portion 32, as illustrated in FIG. 9. Of the two, it is desirable that the dense plug 30 be ceramic-bonded to the bottom surface 20d of the bottomed cylindrical hole 20h as illustrated in FIG. 9, because pressure can be easily applied at the time of ceramic bonding. When the dense plug 30 is ceramic-bonded to the wall surface 20c of the bottomed cylindrical hole 20h as illustrated in FIG. 8, the upper surface 30a of the dense plug 30 may be in contact with the bottom surface 20d of the bottomed cylindrical hole 20h. Alternatively, there may be a gap between the upper surface 30a and the bottom surface 20d. The diameter of the bottomed cylindrical hole 20h may be slightly larger than the diameter of the dense plug 30 (for example, by 0.5 mm or 1 mm).

In the embodiment described above, the gas discharge hole 25 may be configured by, for example, a plurality of small gas holes 25a as illustrated in FIG. 9. In addition, the concave portion 36 may communicate with the plurality of small gas holes 25a. In this way, gas can be supplied to the plurality of small gas holes 25a via the concave portion 36.

While the above embodiment has been described with reference to the cylindrical hole 40h provided in the cooling plate 40 being a through-hole that passes completely through the cooling plate 40 in the thickness direction, the cylindrical hole 40h may be a bottomed hole having a bottom adjacent to the lower surface 40b. In this case, a flow channel that has an opening in the wall surface or the bottom surface of the bottomed cylindrical hole of the cooling plate 40 to communicate with the outside may serve as the gas supply hole 45. Alternatively, as illustrated in FIG. 9, the dense plug 30 may be disposed in the bottomed cylindrical hole 20h of the ceramic plate 20, and the cylindrical hole 40h may be removed. In this case, a flow channel having an opening in the upper surface 40a of the cooling plate 40 may serve as the gas supply hole 45.

In the embodiment described above, a gap is present between the wall surface 40c surrounding the cylindrical hole 40h and the outer peripheral surface 30c of the dense plug 30. However, the gap may be filled with an adhesive. In FIGS. 8 and 9, a gap may be present between the wall surface 20c surrounding the bottomed cylindrical hole 20h and the outer peripheral surface 30c of the dense plug 30, and the gap may be filled with an adhesive.

While the above embodiment has been described with reference to the ceramic plate 20, the dense plug 30, and the joint portion 32 all made of alumina, the three may be made of aluminum nitride, silicon carbide, or silicon nitride, for example. Alternatively, the three may be made of ceramic of another type. When the three are made of aluminum nitride, examples of sintering aids contained in the bonding agent paste 32p include magnesia and yttria. When the three are made of silicon carbide, an example of the sintering aids is yttria. When the three are made of silicon nitride, an example of the sintering aid is zirconia.

While the above embodiment has been described with reference to an electrostatic chuck heater that includes both the electrostatic electrode 22 and the heater electrode 24 and that serves as the ceramic plate 20, the ceramic plate 20 is not limited thereto. For example, the ceramic plate 20 may be an electrostatic chuck including only the electrostatic electrode 22 or may be a ceramic heater including only the heater electrode 24. The ceramic plate 20 may further include a radio frequency (RF) electrode.

While the above embodiment has been described with reference to the ceramic plate 20 and the cooling plate 40 joined by sintering, any joining method can be employed as long as the ceramic joint portion 32 is obtained. For example, the ceramic plate 20 and the cooling plate 40 may be bonded by using a diffusion bonding technique. Alternatively, the two may be bonded with a ceramic adhesive.

Examples of the ceramic adhesive include CERAMA Bond 571, CERAMA Bond 690, and CERAMA Bond 865 available from AREMCO Products Inc., and Aron Ceramic available from Toagosei Chemical Co., Ltd. Note that the organic material contained in the ceramic adhesive volatilizes. Consequently, the ceramic joint portion 32 does not substantially contain an organic material even when the ceramic adhesive is used.

In the embodiment described above, the bonding material paste 32p is applied to the upper surface 30a of the dense plug 30. However, the bonding material paste 32p may be applied to the lower surface 20b of the ceramic plate 20. Alternatively, the bonding material paste 32p may be applied to both the upper surface 30a of the dense plug 30 and the lower surface 20b of the ceramic plate 20.

The present application claims priority from U.S. Patent Application No. 62/738,205 filed on Sep. 28, 2018, the entire contents of which are incorporated herein by reference.

What is claimed is:

1. A member for a semiconductor manufacturing apparatus comprising: a ceramic plate having an upper surface serving as a wafer mounting surface and incorporating an electrode; a ceramic dense plug disposed adjacent to a lower surface side of the ceramic plate and ceramic-bonded to the ceramic plate by a ring-shaped joint portion; a metal cooling plate joined to the lower surface of the ceramic plate in a portion other than the joint portion; and a gas flow channel, wherein the gas flow channel includes a gas discharge hole that passes completely through the ceramic plate in a thickness direction of the ceramic plate and an internal gas flow channel that passes from an upper surface to a lower surface of the dense plug while winding through the dense plug, and wherein the gas flow channel passes inside of an inner periphery of the joint portion.

2. The member for a semiconductor manufacturing apparatus according to claim 1, wherein the joint portion is a ceramic sintered body.

3. The member for a semiconductor manufacturing apparatus according to claim 1, wherein the upper surface of the dense plug is provided with a concave portion that communicates with the gas discharge hole and the internal gas flow channel and that has an opening larger than the internal gas flow channel.

4. The member for a semiconductor manufacturing apparatus according to claim 3, wherein the gas discharge hole is formed from a plurality of small gas holes, and the concave portion communicates with the plurality of small gas holes.

5. The member for a semiconductor manufacturing apparatus according to claim 1, wherein the internal gas flow channel is a channel that is spiral or zigzag in shape.

6. The member for a semiconductor manufacturing apparatus according to claim 1, wherein the dense plug comprises a columnar plug body including the internal gas flow channel and a cylindrical skirt portion protruding from the plug body downward.

7. The member for a semiconductor manufacturing apparatus according to claim 1, wherein the cooling plate includes a cylindrical hole having an opening on the upper surface thereof, and wherein at least part of the dense plug is disposed inside the cylindrical hole.

* * * * *